United States Patent
Sasaki et al.

(10) Patent No.: US 7,056,811 B2
(45) Date of Patent: Jun. 6, 2006

(54) METHOD FOR MANUFACTURING SEMICONDUCTOR DEVICE

(75) Inventors: Kaoru Sasaki, Tottori (JP); Keiji Yamamoto, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/861,155

(22) Filed: Jun. 4, 2004

(65) Prior Publication Data

US 2004/0251520 A1    Dec. 16, 2004

(30) Foreign Application Priority Data

Jun. 10, 2003  (JP) .............................. 2003-165094

(51) Int. Cl.
*H01L 21/30* (2006.01)
*H01L 21/46* (2006.01)

(52) U.S. Cl. ...................... 438/459; 438/689; 438/690; 438/692

(58) Field of Classification Search ................ 438/222, 438/457–459, 689–692
See application file for complete search history.

(56) References Cited

U.S. PATENT DOCUMENTS

| 5,122,481 | A * | 6/1992 | Nishiguchi ................... 438/510 |
| 6,455,774 | B1 | 9/2002 | Webster |
| 6,492,699 | B1 | 12/2002 | Glenn et al. |
| 6,526,653 | B1 | 3/2003 | Glenn et al. |
| 6,583,032 | B1 | 6/2003 | Ishikawa et al. |
| 6,743,696 | B1 | 6/2004 | Jeung et al. |
| 6,791,076 | B1 | 9/2004 | Webster |
| 2004/0036078 | A1 | 2/2004 | Kondo |

FOREIGN PATENT DOCUMENTS

| JP | 59-201425 | 11/1984 |
| KR | 2001-0081952 | 8/2001 |

OTHER PUBLICATIONS

"Minority Carrier Lifetime Measurement of Si Wafers Lapped By the Mechanical Grinding" The Japan Society of Applied Physics, Sep. 1996.
"Minority Carrier Lifetime Measurement of Si Wafers Lapped By the Mechanical Grinding".
"ShellOP Process Flow" Oct. 2001, url:http://www.shellcase.com/pages/products-shellOP-process.asp.
"Drop of Minority Carrier Life Time With Silicon Wafer Surface Due To Silicon Back Surface Damage Due to Grinding" Kei Kinoshita, Smiele SEZ, Inc., Application Group (Sep. 30, 1996).

* cited by examiner

*Primary Examiner*—Thien F. Tran
(74) *Attorney, Agent, or Firm*—Hogan & Hartson, LLP

(57) ABSTRACT

An integrated circuit is formed in each region of a front surface of a semiconductor device. The semiconductor device is mechanically ground so as to be left having a thickness enough to prevent a defect on the back surface from reaching its opposed front surface. Thereafter, the back surface of the semiconductor device is subjected to etching in mainly chemical reaction to thereby smoothe concaves and convexes caused on the back surface of the semiconductor device in mechanical grinding, so that the semiconductor device is made thinner by the amount corresponding to a concave/convex difference. When the back surface of the semiconductor device is smoothed as described above, stress will not concentrate at the concaves and convexes on the back surface of the semiconductor substrate at a later processing stage where a lower supporting base is fixedly formed on the back surface of the semiconductor substrate via an insulating resin layer, whereby a laminated body is formed on the back surface of the semiconductor substrate. This arrangement enhances the reliability of the resulting semiconductor devices.

4 Claims, 12 Drawing Sheets

S12

S16

14
12
26
10
12

16

METHOD FOR MANUFACTURING SEMICONDUCTOR DEVICE

CROSS-REFERENCE TO RELATED APPLICATIONS

The priority application Ser. No. 2003-165094 upon which this patent application is based is hereby incorporated by reference.

BACKGROUND OF THE INVENTION

1. Field of the Invention

The present invention relates to reduction of the thickness of a semiconductor device.

2. Description of the Related Art

In order to reduce product size and weight, there has in recent years been a determined effort towards reduction of the thickness of a semiconductor device components of such products.

In one conventional method for reducing the thickness of semiconductor devices, the back surface of a semiconductor device is mechanically ground. For example, a grinding method which uses a grinder is widely used due to its high productivity. Mechanical grinding of the back surface of a semiconductor substrate, however, may create crystal defects in the semiconductor substrate. Such crystal defects may extend so deep into the semiconductor substrate as to reach the front surface of the semiconductor substrate when the semiconductor substrate is excessively ground. Any such crystal defect severely affects the characteristics of an integrated circuit formed on the front surface of the semiconductor device.

According to another method for reducing the thickness of semiconductor devices, dry or wet etching is applied to a semiconductor substrate. Although the depth of crystal defects which result from use of this method are relatively shallow, the productivity of this method is low due to the slow etching speed.

In other words, for manufacture of a thin semiconductor substrate, the choices heretofore available are a highly-productive grinding method which mechanically grinds the back surface of a semiconductor device, but which causes deep crystal defects, and a method which uses dry or wet etching so as to minimize the occurrence of such crystal defects, but which suffers from poor productivity.

SUMMARY OF THE INVENTION

According to the present invention, there is provided a method for manufacturing a semiconductor device comprising a first step of mechanically grinding a back surface of a semiconductor substrate having an integrated circuit formed on a front surface thereof and a second step of etching the back surface of the semiconductor device, while utilizing a chemical reaction, wherein, at the first step, the semiconductor substrate is ground so as to be left with a thickness sufficient to prevent a defect caused on the back surface thereof from reaching a front surface thereof, and, at the second step, the semiconductor substrate is ground so as to be thinner by an amount corresponding to a concave/convex difference (the difference in height between the depth of a concave feature and the height of a convex feature) formed on the back surface after the first step.

DESCRIPTION OF THE PREFERRED EMBODIMENTS

A method for manufacturing a semiconductor device according to an embodiment of the present invention comprises, as shown in FIGS. 1 to 8, formation of an integrated circuit element and an internal wire (S10), a first formation step of laminated body (S12), grinding (S14), a second formation step of laminated body (S16), cutting (S18), formation of a metal film (S20), formation of a terminal (S22), and dicing (S24).

Figure 1:
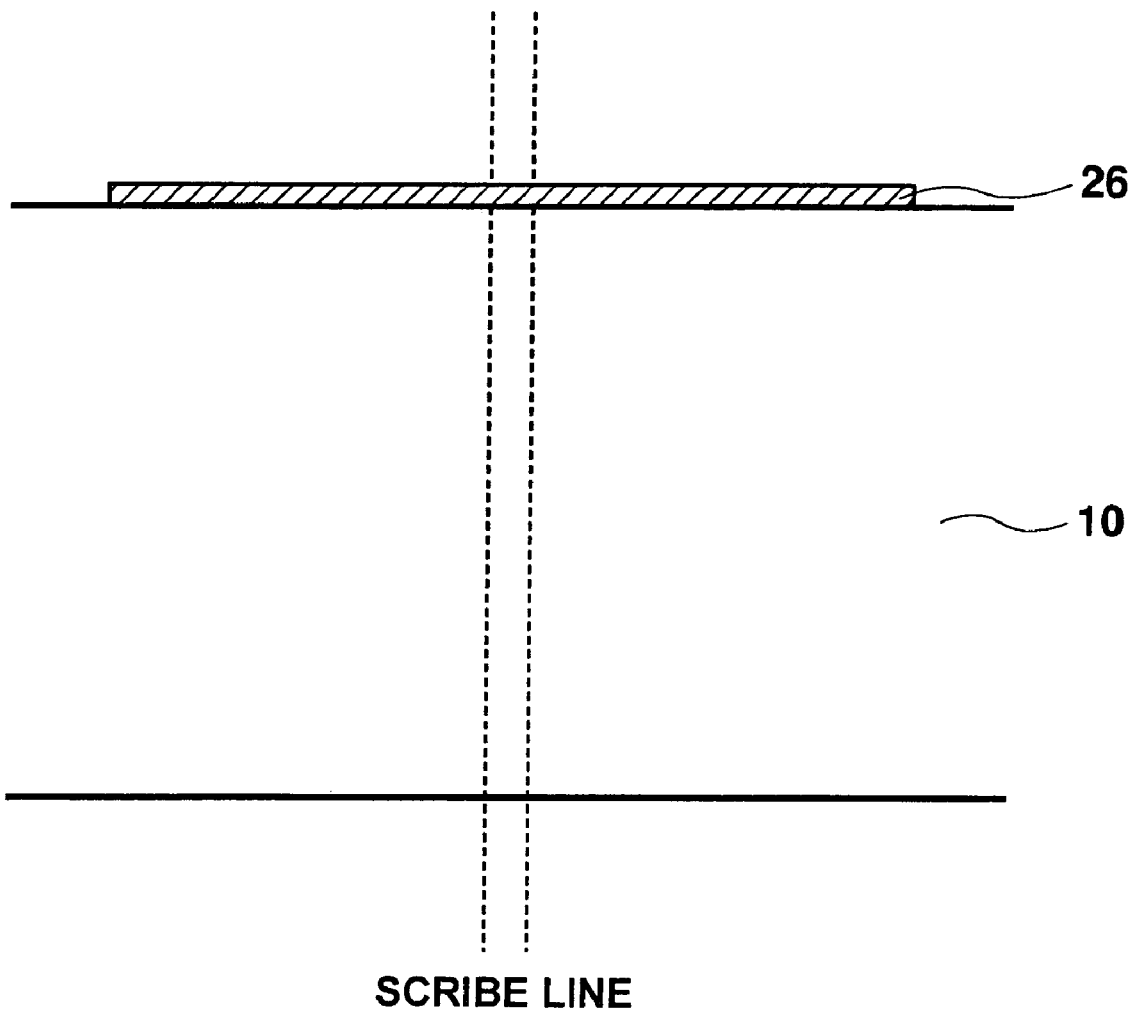
FIG. 1 is a diagram showing formation of an integrated circuit element and an internal wire according to an embodiment of the present invention.

At the step S10 for formation of an integrated circuit element and an internal wire, as shown in FIG. 1, an integrated circuit is formed in each region 10A (not shown in FIG. 1, but illustrated in FIGS. 10 and 11) defined by a scribe line on the front surface of a semiconductor chip 10. Thereafter, an internal wire 26 is formed, via an oxide film, so as to extend toward the boundary relative to an adjacent integrated circuit element. The internal wire 26 is electrically connected to the associated integrated circuit element via a contact hole formed throughout the oxide film.

The semiconductor substrate 10 can be made using a typical semiconductor material such as silicon, gallium arsenide, or the like. An integrated circuit for a light receiving element, such as, a CCD, can be formed in known semiconductor processing. The internal wire 26 can be formed using mainly a material that is generally usable for a semiconductor device, such as silver, gold, copper, aluminum, nickel, titan, tantalum, and tungsten, with aluminum often being preferable in consideration of electrical resistance value and material processability.

Figure 2:
FIG. 2 is a diagram showing a first formation step of laminated body in the embodiment of the present invention.
Figure 2:
Figure 2:
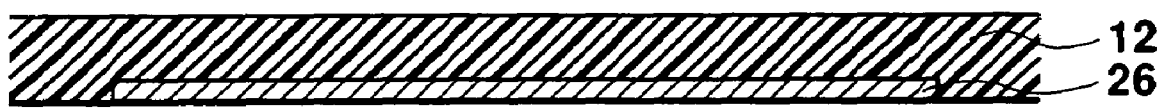
Figure 2:
Figure 2:

At the step S12 for a first formation step of laminated body, as shown in FIG. 2, an upper supporting base 14 is fixedly formed, via a resin layer 12 of epoxy adhesive or the like, on the front surface of the semiconductor chip 10 where the laminated circuit element is formed.

Figure 3:
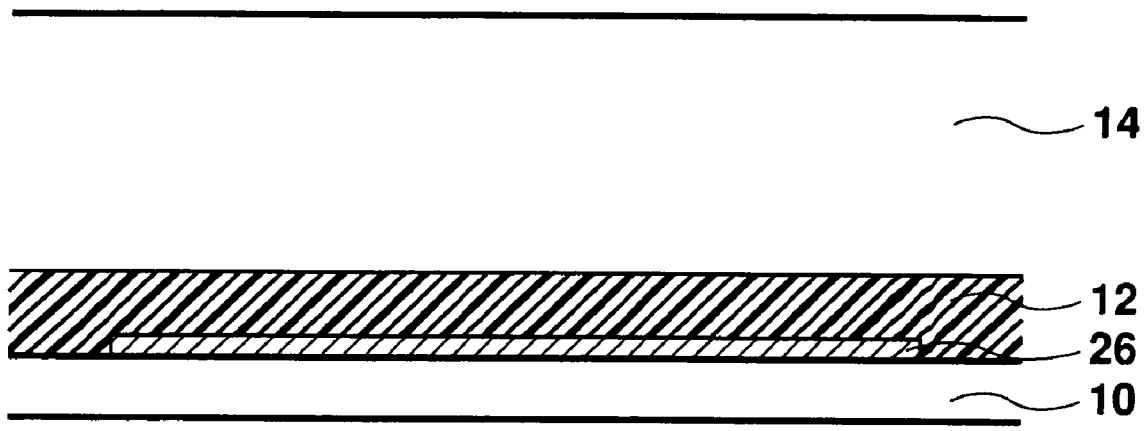
FIG. 3 is a diagram showing grinding in the embodiment of the present invention.
Figure 10:
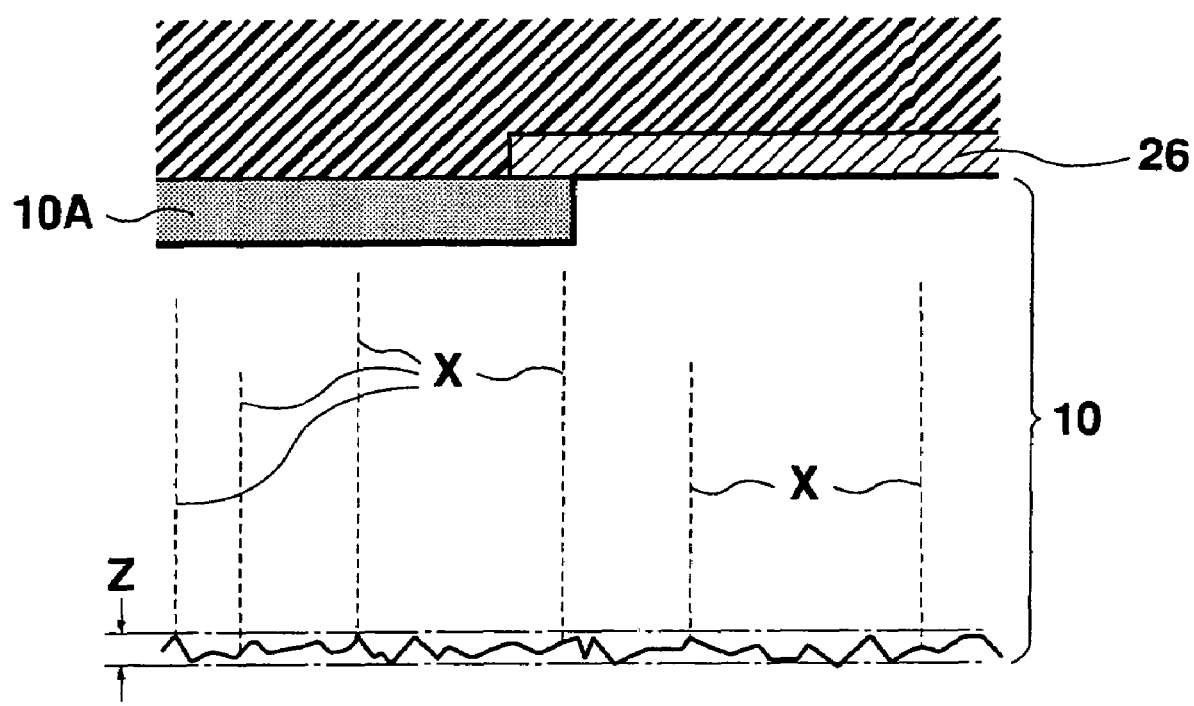
FIG. 10 is an enlarged view showing a semiconductor device subjected to cutting in the embodiment of the present invention.

At the step S14 for grinding, as shown in FIG. 3, the back surface of the semiconductor substrate 10 is mechanically ground, using a grinder or the like, to thereby reduce the thickness of the semiconductor substrate 10. A cross section of a semiconductor device subjected to such mechanical grinding is shown in FIG. 10. It is common that, as a result of mechanical grinding of the back surface of the semiconductor substrate 10, a crystal defect X is formed inside the semiconductor substrate. This crystal defect X may extend to some depth inside the semiconductor substrate from its back surface, even to the extent of reaching the front surface of the semiconductor substrate 10 when the semiconductor substrate 10 is excessively ground. Crystal defect in such a condition may severely affect the characteristics of an integrated circuit formed in each region 10A of the semiconductor substrate 10. For example, with an integrated circuit for a light receiving element, such as a CCD, the defect may appear as a white point defect, and resultantly drops the yield.

In order to address this problem, in mechanical grinding, the semiconductor substrate 10 is ground so as to be left with a thickness thick enough to prevent any crystal defect X caused on its back surface from reaching its opposed front surface. It should be noted that the depth at which the crystal defect X on the back surface of the semiconductor substrate 10 will reach the front surface (may vary depending on the grinding condition, including the particle size of a grinding agent, the number of rotations of a grinding panel, the grinding speed, and so forth.

For example, for a particle size of #1500 and a rate of rotation of 5500 rpm, a crystal defect on a silicon semiconductor substrate can be expected to extend as deep as about 100 μm.

Here, as shown in FIG. 10, the back surface of the semiconductor substrate 10 has a number of convex and concave features formed thereon. (The scale of the features shown in FIG. 10 and other figures is exaggerated for clarification.) The largest difference between a convex top and a concave valley (hereinafter referred to as a concave/convex difference Z) on the back surface of the semiconductor substrate 10 may vary depending on the particle size of the grinding agent.

With such concaves and convexes formed on the back surface of the semiconductor device 10, stress may concentrate at the convex and concave features (hereafter, simply "convexes and concaves") on the back surface of the semiconductor substrate 10 when a lower supporting base 16 is fixedly formed via a resin layer on the back surface of the semiconductor device, to facilitate formation of a laminated body on the back surface of the semiconductor substrate 10 at a later step. Such stress concentration may cause any crystal defect X to extend to an area 10A where an integrated circuit is formed, which severely affects the characteristics of the integrated circuit.

Therefore, in order to reduce the concave/convex difference Z on the back surface of the semiconductor substrate 10, the back surface of the semiconductor substrate 10 is exposed to etching in a mainly chemical reaction, including dry or wet etching which mainly utilizes chemical etching, for example, downflow etching, plasma etching, or the like, or chemical mechanical polishing (CMP). As such etching which mainly utilizes a chemical reaction is isotropic etching, the concave/convex difference Z on the back surface of the semiconductor substrate 10 is reduced and a smooth back surface results.

Figure 11:
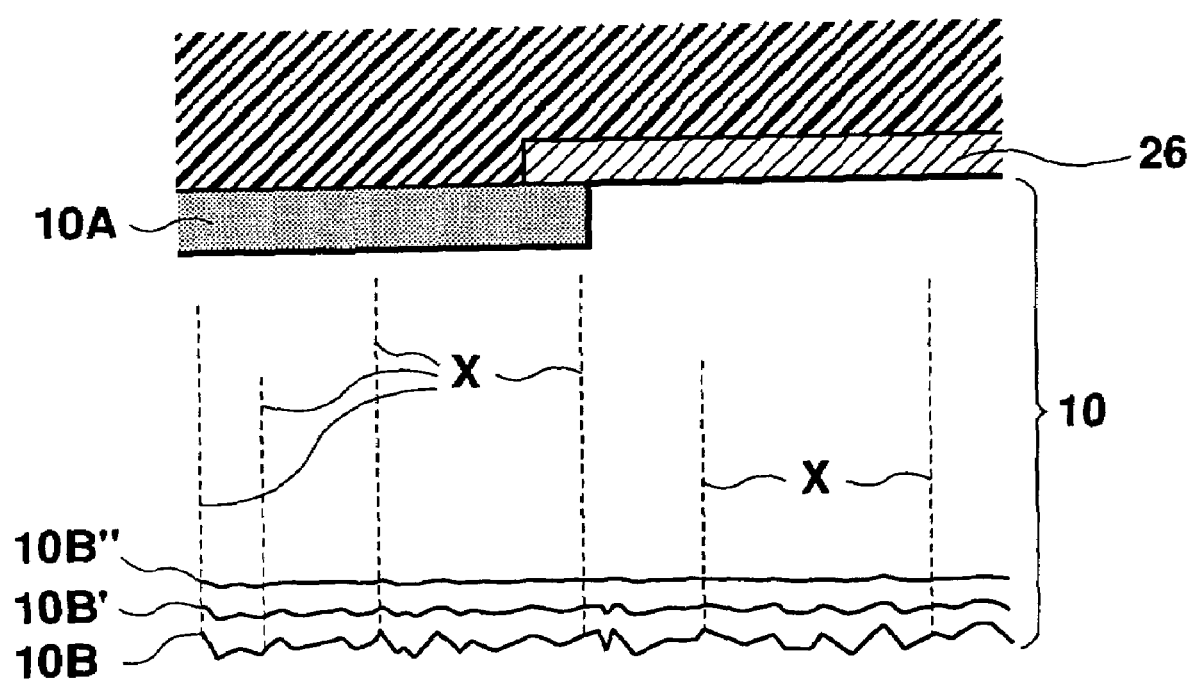
FIG. 11 is an enlarged view showing a semiconductor device subjected to etching utilizing a mainly chemical reaction in the embodiment of the present invention.

FIG. 11 is a cross sectional view showing the process of variation of back surface condition of the semiconductor substrate 10 after exposure to such etching that mainly utilizes a chemical reaction. Specifically, the line 10B represents the back surface of the semiconductor substrate 10 immediately after mechanical grinding applied thereto. After exposure to the chemical etching, the back surface of the semiconductor substrate 10 varies to that which is indicated by the line 10B' and further to the line 10B", that is, becoming smoother.

Such a smooth back surface of the semiconductor substrate 10 is beneficial in preventing stress concentration at convexes and concaves on the back surface of the semiconductor substrate 10, which could otherwise occur at a later step where a lower supporting base 16 is fixedly formed on the back surface of the semiconductor substrate 10 via an insulating resin layer 12 whereby a laminated body is formed on the back surface of the semiconductor substrate 10. As a result, a crystal defect X can be prevented from extending to an area 10a where an integrated circuit is formed, so that the integrated circuit can preserve its preferable characteristics. This, in turn, can enhance reliability of the operation of the semiconductor device.

Figure 4:
FIG. 4 is a diagram showing a second formation step of laminated body in the embodiment of the present invention.
Figure 4:
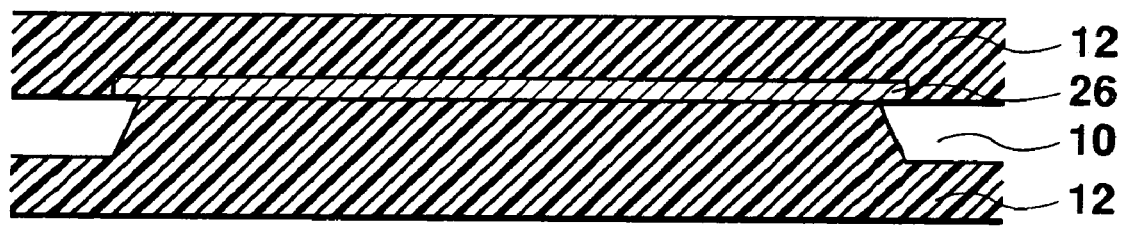
Figure 4:

For the step S16 for a second formation step of laminated body, as shown in FIG. 4, the back surface of the semiconductor substrate 10 is further etched along the scribe line such that the surface of the oxide film where the internal wire 26 is formed is exposed to the outside. Then, a lower supporting base 16 is fixedly formed on the back surface of the semiconductor substrate 10 by means of a resin layer 12 of epoxy adhesive or the like, whereby a laminated body is formed on the back surface of the semiconductor substrate 10.

The upper supporting base 14 and the lower supporting base 16 can be formed using a material desirably selected from those which are useable for packaging of a semiconductor device, including, glass, plastic, metal, ceramic, or the like. For example, in the case where a light receiving element, such as a CCD, is formed on a semiconductor substrate, transparent glass or plastic is preferably used to form the upper supporting base 14.

Figure 5:
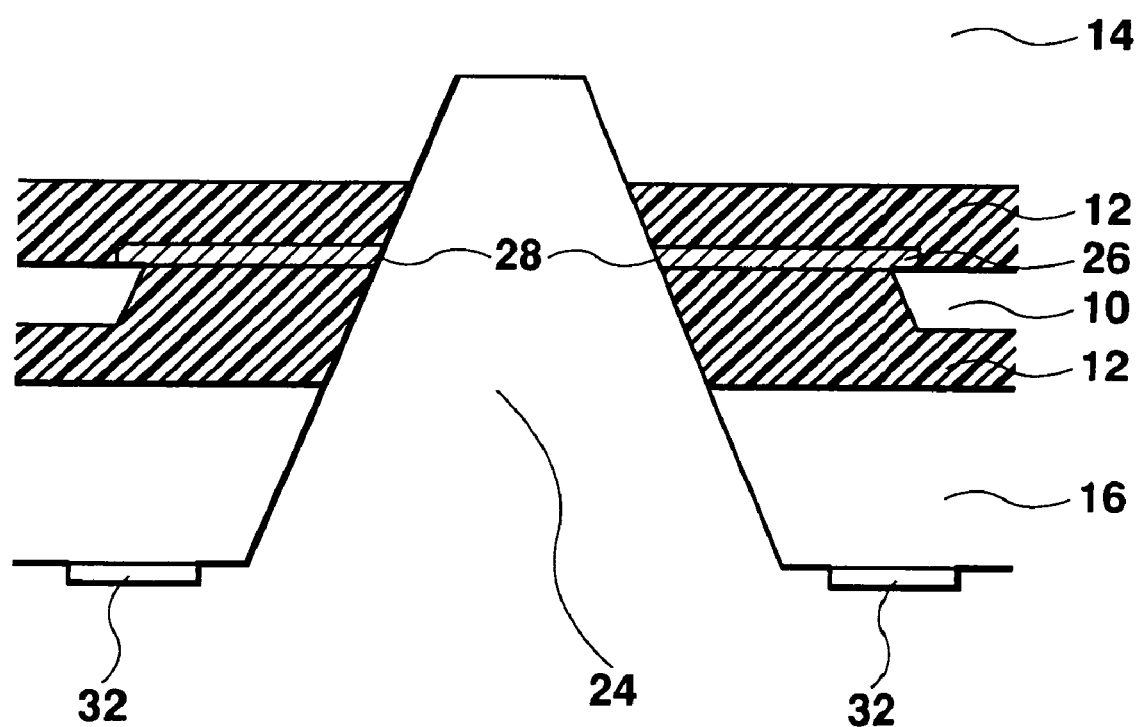
FIG. 5 is a diagram showing cutting in the embodiment of the present invention.

At the step S18 for cutting, as shown in FIG. 5, a buffer member 32 is formed on the back surface of the lower supporting base 16 at a position where a ball terminal 20 is to be formed at a subsequent step. The buffer member 32 will serve as a cushion for buffering stress applied to the ball terminal 20. The buffer member 32 may be formed using flexible material adapted to patterning, with light sensitive epoxy resin being preferably used.

Thereafter, an inverted-V shaped groove (a cut-off groove) 24 is formed on the lower supporting base 16, using a dicing saw or the like, so as to be deep enough to reach the opposed upper supporting base 14. As a result, the end portion 28 of the internal wire 26 is exposed to the outside along the inside surface of the cut-off groove 24.

Figure 6:
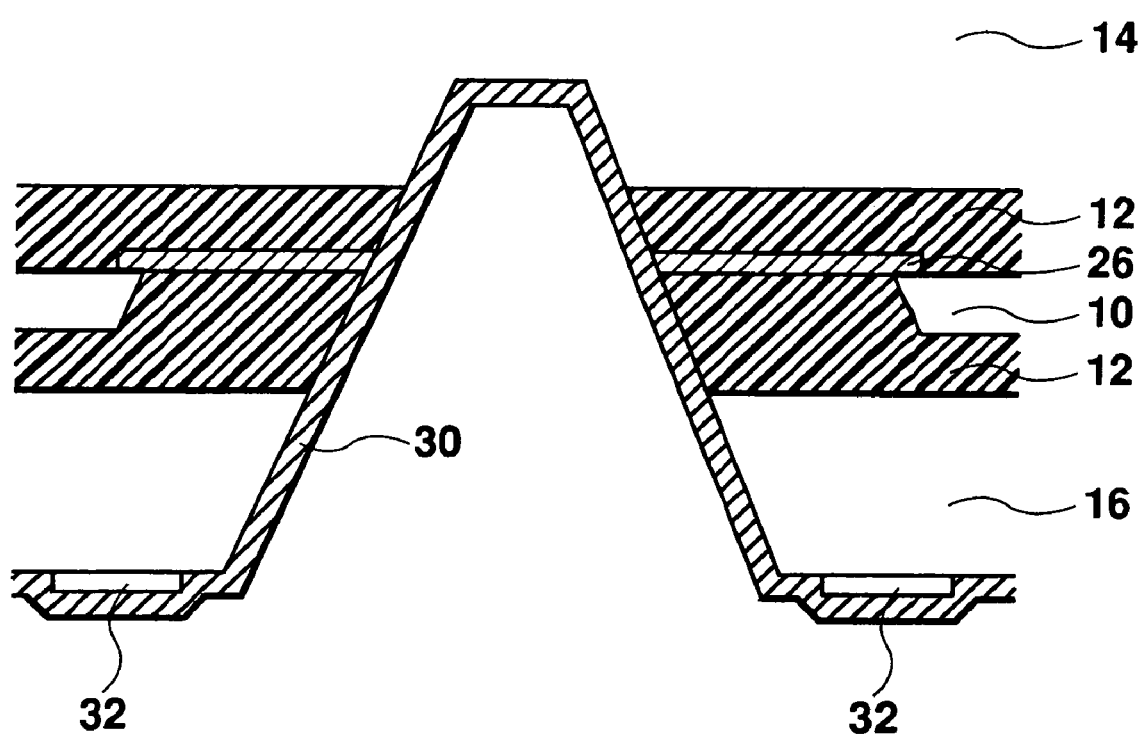
FIG. 6 is a diagram showing formation of a metal film in embodiment of the present invention.

At step S20 for formation of a metal film, as shown in FIG. 6, a metal film 30 is formed on the lower supporting base 16 where the cut-off groove 24 is formed. As covering the bottom and lateral surfaces of the cut-off groove 24, the metal film 30 is electrically connected to the internal wire 26. Thereafter, the metal film 30 is patterned into a predetermined wire pattern.

It should be noted that the metal film 30 can be formed using mainly a material that is generally usable for a semiconductor device, such as silver, gold, copper, aluminum, nickel, titan, tantalum, and tungsten, with aluminum often being preferable in consideration of electrical resistance value and material processability.

Figure 7:
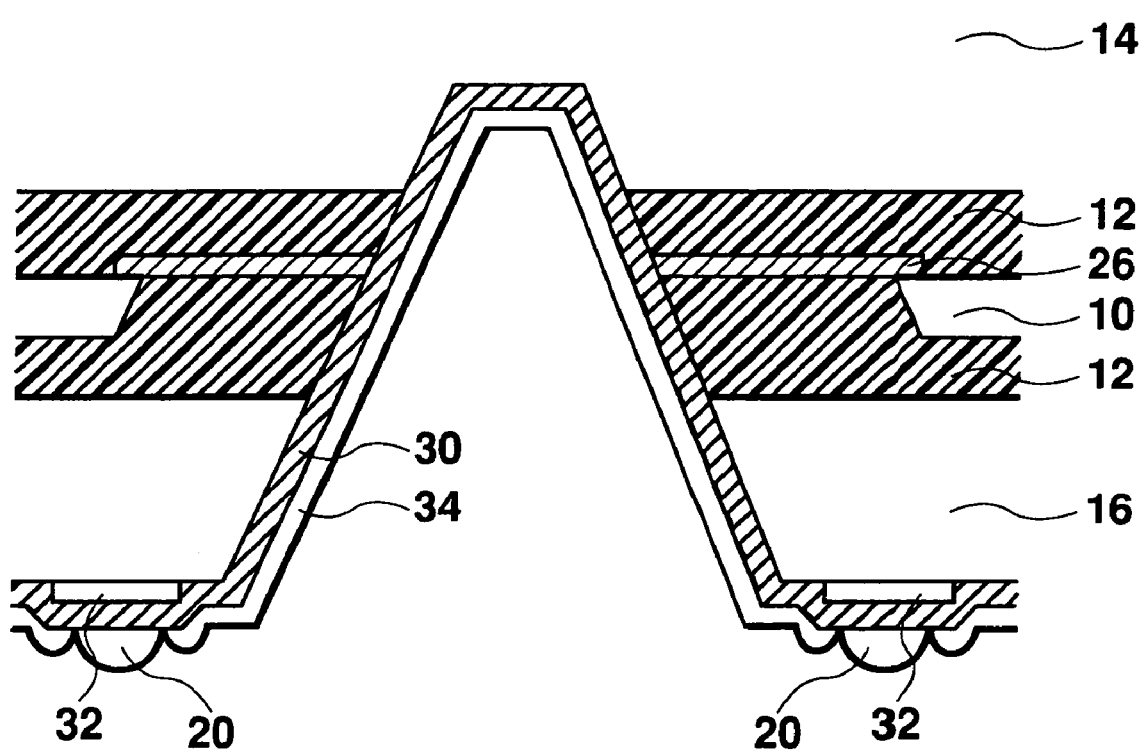
FIG. 7 is a diagram showing formation of a terminal in the embodiment of the present invention.

At step S22 for formation of a terminal, as shown in FIG. 7, a protection film 34 is formed so as to completely cover the back surface of the lower supporting base 16 except an area corresponding to the buffer member 32. The protection film 34 is formed using a material adapted to patterning, with light sensitive epoxy resin or the like being preferably used, similar to the buffer member 32. A ball terminal 20 is thereafter formed as an outside terminal on the buffer member 32 on the lower supporting base 16, using, for example, a solder material and a conventional method.

Figure 8:
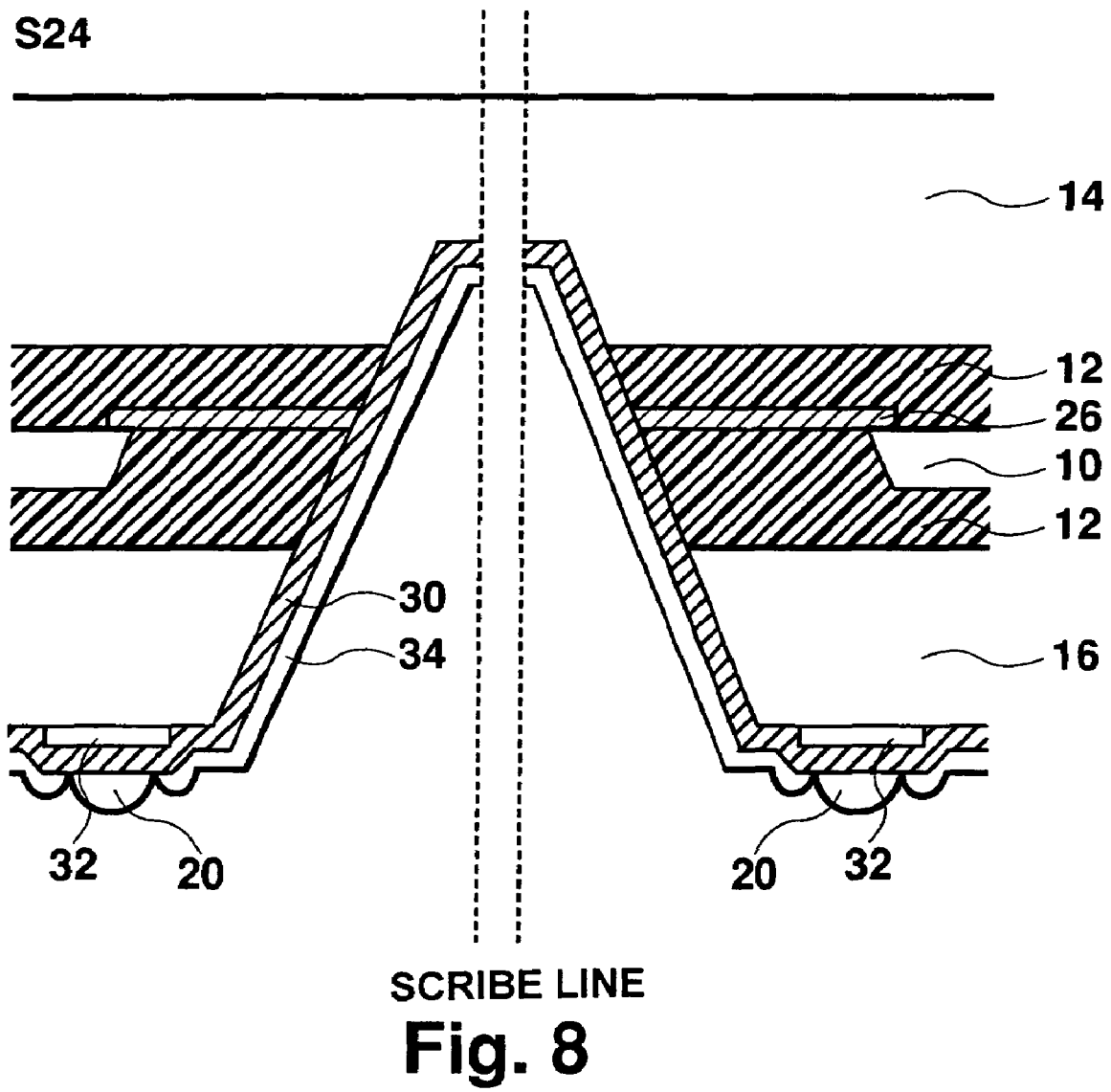
FIG. 8 is a diagram showing dicing in the embodiment of the present invention.

At step S24 for dicing, as shown in FIG. 8, the resultant laminated body is cut into individual semiconductor devices along a scribe line assumed along the bottom portion of the cut-off groove 24, using a dicing saw or the like.

Figure 9A:
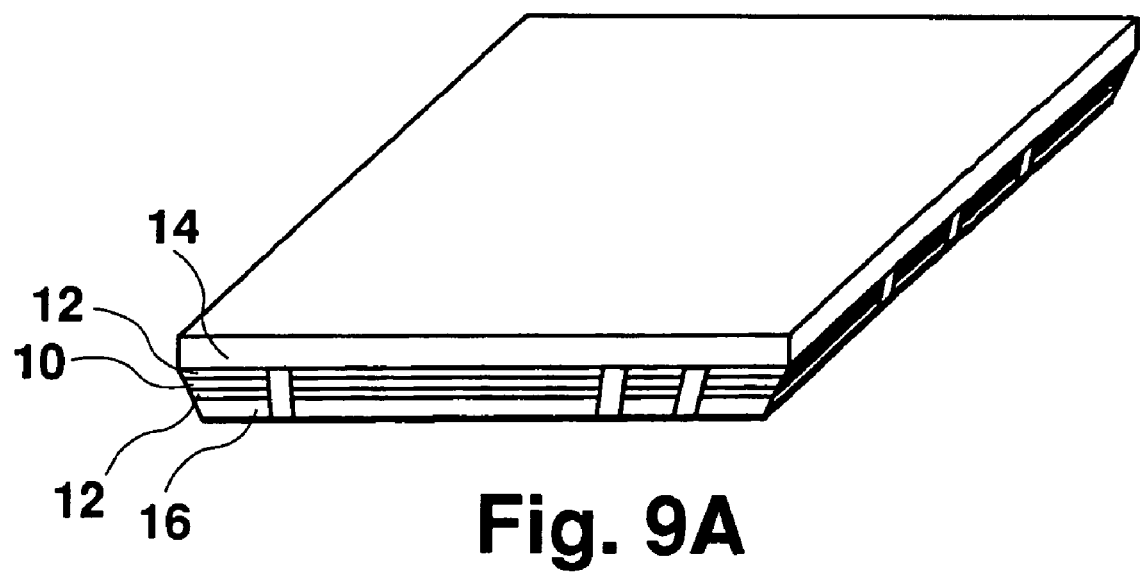
FIG. 9A is a diagram showing an external appearance of an upper side of a semiconductor device utilizing a chip size package.
Figure 9B:
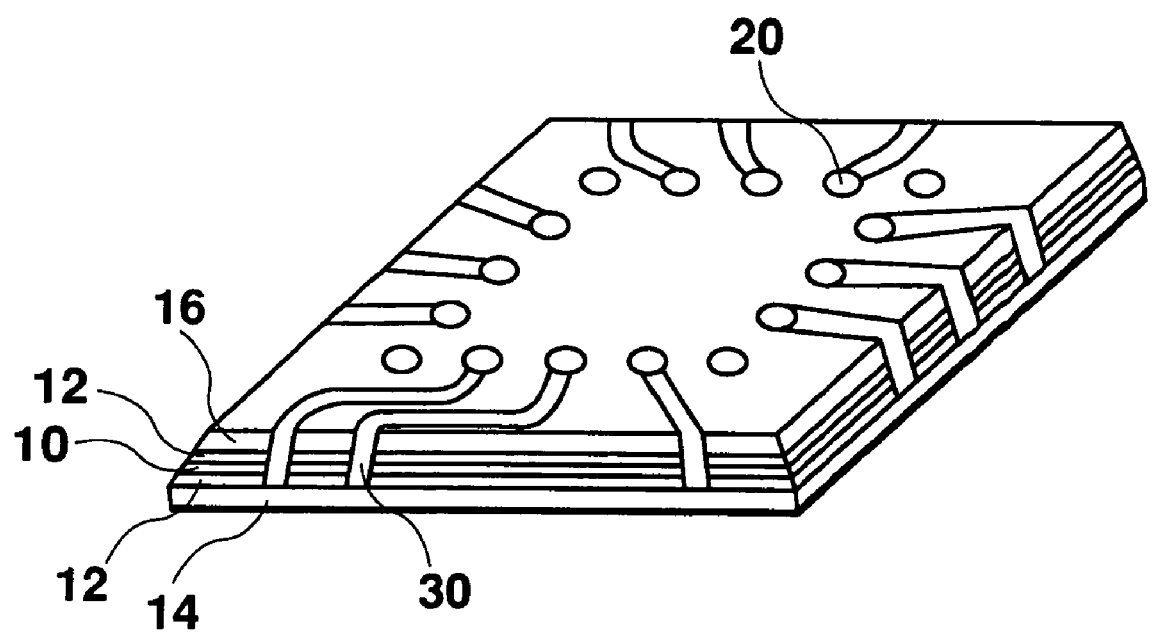
FIG. 9B is a diagram showing an external appearance of a lower side of a semiconductor device utilizing a chip size package.

Using the above described manufacturing method, a solid image capturing element utilizing a chip size package and having an external appearance as shown in FIG. 9 is manufactured. This solid image capturing element has a structure in which a light receiving element is formed on a semiconductor chip 10 and sandwiched via the resin layers 12 of epoxy or the like between the upper supporting base 14 and the lower supporting base 16, with the outside wire 30 extending from the lateral side of the resultant body, to be connected to the ball terminal 20 formed on the back surface of the solid image capturing element.

It should be noted that, although the above example describes a structure in which a ball terminal to serve as an external terminal is formed on the back surface of a semiconductor substrate having a laminated body fixedly formed thereon, which contains a supporting base fixedly mounted on the semiconductor substrate via an insulating resin, the problem solved by the manufacturing method of the present invention is also present in a structure in which a ball terminal is formed on the front surface of a semiconductor substrate. Therefore, the manufacturing method of the present invention is similarly effective with such a structure, and results in similar advantages.

Specifically, an integrated circuit is formed in each region defined by a scribe line on the front surface of a semiconductor chip 10 and an internal wire 26 is additionally formed so as to extend toward the boundary relative to an adjacent integrated circuit element. Then, an upper supporting base 14 is fixedly formed on the front surface of the semiconductor substrate 10 via the insulating resin layer 12 so as to cover an area where the integrate circuit is formed, whereby a laminated body is formed on the front surface of the semiconductor substrate 10. Thereafter, the insulating resin layer 12 and the internal wire 26 are partly removed along the scribe line, while leaving a part of the semiconductor substrate 10, to thereby form a groove 24 where parts of the insulating resin layer 12 and the internal wire 26 are exposed to the outside. Then, a metal film 30 is formed covering the front surface of the semiconductor substrate 10 as well as the groove 24 and, then, patterned into an outside wire. Thereafter, the back surface of the semiconductor substrate 10 is mechanically ground in such a manner that a crystal defect on the back surface of the semiconductor substrate 10 does not reach the front surface of the semiconductor substrate 10. The resultant semiconductor substrate 10 is then exposed to etching through a mainly chemical reaction to thereby smoothe the concaves and convexes formed on the back surface of the semiconductor substrate 10. Subsequently, the semiconductor substrate 10 is removed along the scribe line, and a lower supporting base is fixedly formed on the back surface of the semiconductor substrate 10 via an insulating resin layer, whereby a laminated body is formed on the back surface of the semiconductor substrate 10. Finally, the laminated body is cut along the scribe line into individual semiconductor devices.

It should also be noted that the problem solved by the present invention is also present during package assemblage and/or semiconductor chip mounting in manufacturing of typical semiconductor devices. Therefore, the manufacturing method of the present invention is similarly effective in such situations, and results in a similar advantage.

As described above, according to the present invention, the thickness of a semiconductor device formed on the front surface of the semiconductor substrate can be reduced through reduction of the effect of crystal defect caused in the process of mechanical grinding without deteriorating either productivity or the characteristics of the integrated circuit formed on the surface of a semiconductor device.

What is claimed is:

1. A method for manufacturing a semiconductor device, comprising:
    a first step of mechanically grinding a back surface of a semiconductor substrate having an integrated circuit formed on a front surface thereof; and
    a second step of etching the back surface of the semiconductor substrate, while utilizing chemical reaction,
    wherein
    at the first step, the semiconductor substrate is ground so as to be left having a thickness sufficient to prevent a defect caused on the back surface thereof from reaching a front surface thereof,
    at the second step, the semiconductor substrate is etched so as to be thinner by an amount corresponding to a concave/convex difference found on the back surface after the first step, and
    after the second step, a supporting base is fixedly formed on the back surface of the semiconductor substrate via a resin layer, whereby a laminated body is formed on the back surface of the semiconductor substrate.

2. A method for manufacturing a semiconductor device, comprising:
    a first step of forming an integrated circuit in each region defined by a scribe line on a front surface of a semiconductor substrate and forming an internal wire extending toward a boundary relative to an adjacent integrated circuit region;
    a second step of fixedly forming an upper supporting base on the front surface of the semiconductor substrate via an insulating resin layer so as to cover an area where the integrated circuit is formed, whereby a laminated body is formed;
    a third step of removing a part of the insulating resin layer and a part of the internal wire along the scribe line while leaving a part of the semiconductor substrate to thereby form a groove where a part of the insulating resin layer and a part of the internal wire are exposed to outside;
    a fourth step of forming a metal film covering the front surface of the semiconductor substrate and the groove;
    a fifth step of patterning the metal film into an outside wire;
    a sixth step of mechanically grinding the back surface of the semiconductor substrate;
    a seventh step of etching the back surface of the semiconductor substrate, while utilizing chemical reaction;
    an eighth step of removing the semiconductor substrate along the scribe line;

a ninth step of cutting the laminated body along the scribe line to thereby divide the laminated body into individual semiconductor devices, wherein at the sixth step, the semiconductor substrate is ground so as to be left having a thickness sufficient to prevent a defect caused on the back surface thereof from reaching the front surface thereof, and at the seventh step, the semiconductor substrate is etched so as to be thinner by an amount corresponding to a concave/convex difference found on the back surface after the sixth step.

3. A method for manufacturing a semiconductor device, comprising:

a first step of forming an integrated circuit in each region defined by a scribe line on a front surface of a semiconductor substrate and forming an internal wire extending toward a boundary relative to an adjacent integrated circuit region;

a second step of fixedly forming an upper supporting base on the front surface of the semiconductor substrate via an insulating resin layer so as to cover an area where the integrated circuit is formed;

a third step of mechanically grinding the back surface of the semiconductor substrate;

a fourth step of etching the back surface of the semiconductor substrate, while utilizing chemical reaction;

a fifth step of removing the semiconductor substrate along the scribe line and fixedly forming a lower supporting base on the back surface of the semiconductor substrate via an insulating resin layer, whereby a laminated body is formed on the back surface of the semiconductor substrate;

a sixth step of removing a part of the insulating resin layer and a part of the internal wire while leaving a part of the upper supporting base to thereby form a groove where a part of the insulating resin layer and a part of the internal wire are exposed to outside;

a seventh step of forming a metal film covering the back surface of the semiconductor substrate and the groove;

an eighth step of patterning the metal film into an outside wire; and a ninth step of cutting the upper supporting base to thereby divide the laminated body into individual semiconductor devices, wherein at the third step, the semiconductor substrate is ground so as to be left having a thickness sufficient to prevent a defect caused on the back surface thereof from reaching the front surface thereof, and at the fourth step, the semiconductor substrate is etched so as to be thinner by an amount corresponding to a concave/convex difference found on the back surface after the third step.

4. The method for manufacturing a semiconductor device according to claim 3, wherein the integrated circuit formed on the front surface of the semiconductor substrate is a light receiving element and the upper supporting base is a transparent supporting base.

* * * * *